(12) United States Patent
Pizzato (10) Patent No.: US 9,819,342 B2
(45) Date of Patent: Nov. 14, 2017

(54) HAND-OPERATED SAFETY SWITCH WITH TIME DELAY

(71) Applicant: PIZZATO ELETTRICA S.R.L., Marostica (vi) (IT)

(72) Inventor: Marco Pizzato, Marostica (IT)

(73) Assignee: PIZZATO ELETTRICA S.R.L., Via Turin, Marostica (IT)

( * ) Notice: Subject to any disclaimer, the term of this patent is extended or adjusted under 35 U.S.C. 154(b) by 180 days.

(21) Appl. No.: 14/895,942

(22) PCT Filed: Dec. 8, 2014

(86) PCT No.: PCT/IB2014/066709
§ 371 (c)(1),
(2) Date: Dec. 4, 2015

(87) PCT Pub. No.: WO2015/083144
PCT Pub. Date: Jun. 11, 2015

(65) Prior Publication Data
US 2016/0156351 A1    Jun. 2, 2016

(30) Foreign Application Priority Data

Dec. 6, 2013 (IT) ................................ VI2013A0291

(51) Int. Cl.
*H02H 11/00* (2006.01)
*H03K 17/95* (2006.01)
(Continued)

(52) U.S. Cl.
CPC ........... *H03K 17/95* (2013.01); *H01H 27/002* (2013.01); *H03K 17/965* (2013.01); *H03K 17/968* (2013.01); *H03K 2217/958* (2013.01)

(58) Field of Classification Search
CPC .... H03K 17/95; H03K 17/965; H03K 17/968; H01H 27/002
(Continued)

(56) References Cited

U.S. PATENT DOCUMENTS

2016/0133416 A1* 5/2016 Pizzato ................ H01H 27/002
361/142
2017/0141493 A1* 5/2017 Pizzato ................ H01R 9/2633

FOREIGN PATENT DOCUMENTS

DE    10 2011 121235 A1    6/2013
EP       0 849 750 A2       6/1998
(Continued)

*Primary Examiner* — Thomas Skibinski
(74) *Attorney, Agent, or Firm* — Luoh J. Wu; Continent Patent Office LLP (57) ABSTRACT

An hand-operated safety switch with time delay (1) comprises a switching device (2) adapted to be anchored to a fixed part of the protection and provided with switching means (5) adapted to be connected to a plant to be controlled, an operating device (3) adapted to be anchored to a movable part of the protection for interacting with the switching means (5) upon the closing of the movable part. The switching device (2) comprises a locking mechanism (9) associated with the switching means (5) and adapted to selectively hold/release the operating device (3) and hand-operable unlocking means (10) operatively coupled with the locking mechanism (9) for unlocking the operating device (3) with a predetermined time delay with respect of the switching of the power supply circuit by the switching means (5). The switching device (2) has sensor means (13) operatively coupled with the switching means (5) for modifying their operative condition in function of an inlet signal. The operating device (3) also comprises a transmitter (14) adapted to send a proximity signal to be received as input by the sensor means (13) for controlling the switching means (5) when said transmitter (14) is place at a predetermined (Continued)

minimum distance from the sensor means (13). The locking mechanism (9) also comprises an inner passage (29) adapted to allow the passage of means for connecting the sensor means (13) with the switching means (5) avoiding the interference with the unlocking means (10).

10 Claims, 7 Drawing Sheets

(51) Int. Cl.
  *H01H 27/00* (2006.01)
  *H03K 17/965* (2006.01)
  *H03K 17/968* (2006.01)

(58) Field of Classification Search
  USPC .................................. 307/326–328; 361/142
  See application file for complete search history.

(56) References Cited

FOREIGN PATENT DOCUMENTS

| | | |
|---|---|---|
| EP | 0 987 726 A2 | 3/2000 |
| WO | 2013/098788 A1 | 7/2013 |

\* cited by examiner

HAND-OPERATED SAFETY SWITCH WITH TIME DELAY

TECHNICAL FIELD

The present invention finds application in the field of electrical safety devices and in particular relates to a hand-operated safety switch with time delay.

STATE OF THE ART

The structures for protection of machines and industrial plants, such as barriers and protection panels, are normally provided with one or more safety switches designed to be applied at the access areas to allow the start of the system only in the safe condition of closed protection, stopping it automatically at the opening of the protection.

Typically, these particular switches comprise a case designed to be applied to a fixed part of the protection and housing thereinside the electrical and electronic switching components for connecting the switch to the system to be controlled.

In turn, an operating element designed to interact with the switch to open/close one or more circuits connected to the switch itself upon the opening and closing of the panel or other movable part is fixed in correspondence of the door or opening panel of the protection.

In this way, the activation of the system is made possible only when the protection is in safe state of closed panel, wherein there is interaction between the switching portion and the operating element.

In this context, the switches having greater diffusion provide an interaction between the movable actuator and the circuit portion contained in the fixed case through a slot in the case.

Through this slot it will be possible to insert a suitably shaped actuator, e.g, key-shaped, to act on a mechanism for locking/unlocking appropriate contacts in the case, as disclosed for example in U.S. Pat. No. 7,456,368 and in DE10056458.

The actuator is also designed to interact with a locking device housed within the case to be locked by the same in order to avoid that the door can be opened by unauthorized people when the plant is still working.

Therefore, in order to open the protection it has first to proceed to the unlocking of said locking mechanism, which will be suitably connected to the switching means provided in the same case in such a way that their unlocking necessarily lead to the switching of the power supply circuit of the system in the opened condition, with consequent stop thereof.

Electronically actuated switches are also known, an example of which is disclosed in WO2013098788, in which the switching means are activated by a proximity signal transmitted by an operating device of electronic type provided with an electronic tag and captured by an antenna housed in the case.

WO2013/087183 discloses in turn a safety switch with mechanical key operation, but provided with a proximity sensor adapted to communicate with the actuator key, having in turn an inductive solenoid, to detect its presence.

The connection between the proximity sensor and the switching means is realized by means of wires located externally to the case.

Among the mechanically operated switches, switches are also known having a locking mechanism controlled by hand-operated control means, which provide one or more commands, such as emergency mushroom-buttons, key switches or the like, designed to interact with the locking mechanism in response to a specific action exerted from the outside by a user.

For example, from EP0849750 a hand-operated safety switch of the type disclosed above is known which includes time delay means adapted to interact with the locking mechanism to allow the unlocking thereof with delay with respect of the opening of the supply circuit of the system.

In particular, the delay means are constituted by a screw/nut coupling adapted to be maneuvered from outside through a wheel to promote translational motion of a locking rod designed to interact with the actuator when the latter is in the inserted position.

The rod on the opposite side to the actuator is connected to the switching contacts of the circuit so that in the first part of the stroke of the rod only the opening of the contacts occurs without unlocking the actuator.

A first drawback of such timed hand-operated switches is their relatively low safety degree as they are not provided with means which prevent negligent or fraudulent conducts that may lead to the opening of the plant in an unsafe conditions, especially with open protection, since it is always possible to operate the switch with no specifically designed actuators.

Furthermore, the possibility that dust or dirt creep into the slot makes the switches unreliable.

Not least, the time lag between opening of the contacts and unlocking of the actuator is due only to means of a mechanical nature which generally have a relatively high fail degree.

Moreover, these types of switches are not provided with control systems to be used in all those conditions in which it is required a particularly high degree of safety.

SCOPE OF THE INVENTION

The object of the present invention is to overcome the above drawbacks, by providing a hand-operated safety switch with time delay which has high efficiency and relative cheapness.

A particular object is to provide a hand-operated safety switch with time delay which is particularly safe and prevent unauthorized openings and/or closings of the relative accesses, always ensuring that the start of the plant takes place in a safe condition of closed protection.

A particular object is to provide a hand-operated safety switch with time delay housing inside switching means of electronic or electromechanical type and in which the electronic components are protected from contact with the movable mechanical components of the time delay unlocking means.

Still another object is to provide a hand-operated safety switch with time delay which has high reliability and ensures that the opening of the supply circuit of the controlled plant takes place before unlocking of the movable part of the protection.

These objects, as well as others which will appear more clearly hereinafter, are achieved by a hand-operated safety switch with time delay which, according to claim 1, comprises a switching device adapted to be anchored to a fixed part of the protection and provided with switching means adapted to be operatively connected at least to the supply circuit of the system to be controlled for the opening/closing thereof, and an operating device adapted to be anchored to a movable part of the protection for interacting with said switching means at the closure of the movable part on the fixed part.

The switching device comprises a locking mechanism associated with said switching means and adapted to selectively retain/release said operating device and hand-operable unlocking means operatively coupled to said locking mechanism to operate the unlocking of said operating device with a predetermined time delay with respect to the switching of the power supply circuit by said switching means.

Furthermore, the switching device has sensor means operatively coupled to said switching means to modify its state as a function of an input signal, said operating device comprising a transmitter adapted to send a proximity signal designed to be received as input by said sensor means for controlling said switching means when said transmitter is placed at a predetermined minimum distance from said sensor means.

In turn, the locking mechanism comprises an inner axial passage adapted to allow the passage of means for connection of said sensor means with said switching means avoiding the interference with said unlocking means.

Thanks to this particular combination of features it will be possible to confer a relatively high degree of safety also to a hand-operated switch since it will not be possible to operate on the switching means in an unsafe conditions and/or unauthorized condition, in particular with the protection in open condition, as it is necessary that the specific operating device is sufficiently close to the switch device.

Moreover, the presence of the inner passage for the electrical connection means will allow to apply in a secure manner the unlocking means of the mechanical type to an electronically actuated switch, i.e. to a switch provided already a high degree of safety, as it will prevent that the movable mechanical parts of the unlocking means may interfere with the connection means.

At the same time it will avoid to connect the sensor means to the switching means by means of connections external to the case that are generally cause of potential risks and fails, for example due to possible contact with the movable parts of the operating device.

Advantageously, the operating device may present a centering pin adapted to be inserted, at the time of closure of the protection, in a centering hole provided in said switching device for engaging said locking mechanism.

The provision of a pin and of a centering hole mutually coupled will make always possible to ensure a sufficient alignment between the parts, not necessarily precise, making the switch particularly reliable and allowing to recover any longitudinal and/or transverse misalignments between the devices due to a not accurate assembly.

Suitably, said switching device comprises a locking mechanism with a longitudinal rod mechanically coupled to said unlocking means to translate longitudinally with a predetermined maximum stroke between a first limit locking position of said operating device and a second limit unlocking position thereof.

Moreover, the switching means will preferably be of the electromechanical or electronic type and comprise a position detector connected to an electronic control logic microprocessor unit and positioned so as to detect the translation of said longitudinal rod towards said second limit position in response to a partial longitudinal stroke thereof lower than said maximum stroke to send to said control logic unit a control signal for the opening of the supply circuit.

This additional feature will allow to eliminate the mechanical components typical of the known hand-operated switches, making this type of switch more reliable.

Moreover, the presence of the logic microprocessor unit will allow to integrate in this type of switch different control functions generally implemented in electronically-operated switches.

Suitably, the operating device may comprise a transponder adapted to send said proximity signal associated with an identification code, while the sensor means may comprise a receiver adapted to be placed at said transponder for receiving said proximity signal when said transponder is arranged at a predetermined minimum distance from said head and send said identification code to said logic control unit.

In this way the head will be devoid of the typical slots normally provided to allow the access of the operating element to the control mechanism of the switching means, in order to make impossible the activation of the switching means by operating elements other than the one applied to the movable part.

The operating element will be characterized by a unique identification code that should to be recognized univocally by the logic unit.

The absence of the slot required to house the known key actuators or the like will also improve the cleaning of the switch, making it more efficient and usable even in environments with high presence of dust.

Advantageously, the switching device may comprise a head provided with said centering hole and said sensor means and movably fastened to a case for at least partially rotating about an axis of rotation substantially central with respect to said head and to vary the orientation of said centering hole and/or said sensor means with respect to said case.

In this way, the switch configuration may be modified in a simple and quick manner to adapt to the specific configuration of the barrier or protection to which the switch is designed and in particular to make a single circuit breaker adapted to be applied in universal manner to both hinged barriers and sliding barriers, either with right closure of left closure.

Advantageously, the case may comprise axial fastening means of said head adapted to prevent or limit its longitudinal translation with respect to said case, while still leaving free rotation about said central axis.

This configuration will be particularly advantageous in presence of switching means of the electromechanical or electronic type in which the sensor means are connected to the logic unit by means of cables as the switch can be always supplied in the assembled condition, but leaving the possibility to the end user to choose the best orientation for the head as the latter will be free to rotate as long as no provision is made to lock through suitable fastening means, without that it can be completely removed from the case.

Suitably, the case may be provided with a cylindrical opening for the insertion of a tubular axial projection of said head, said cylindrical opening and said tubular projection being provided with respective abutment elements suitable for interacting with each other upon rotation of said head for limiting it to a value less than 360°.

This configuration will avoid that the head may carry one or more complete turns around the central axis which may cause the winding of the cables for the connection of the sensor means to the switching means, with the risk of damaging the same.

Advantageous forms of the invention are obtained according to the dependent claims.

BRIEF DISCLOSURE OF THE DRAWINGS

Further features and advantages of the invention will become more apparent in light of the detailed description of some preferred but not exclusive embodiments of a hand-operated safety switch with time delay, illustrated by way of non-limiting example with the aid of the accompanying drawing, in which.

BEST MODES OF CARRYING OUT THE INVENTION

With reference to the attached figures two preferred but not exclusive embodiments of a hand-operated safety switch with time delay according to the invention are shown, which switches being designed to be applied, in a preferred but not exclusive manner, to protection of the barrier type or movable panel type adapted to prevent unsafe access to a machine or industrial plant during operation.

In known manner, the switch will be designed to be applied to the protection in correspondence of an access thereof to allow the start of the system only in condition of closed access and to stop in a substantially immediate manner the operation of the machine or plant in the case of opening of a door or of a closure panel of such access, according to procedures described below.

Figure 1:
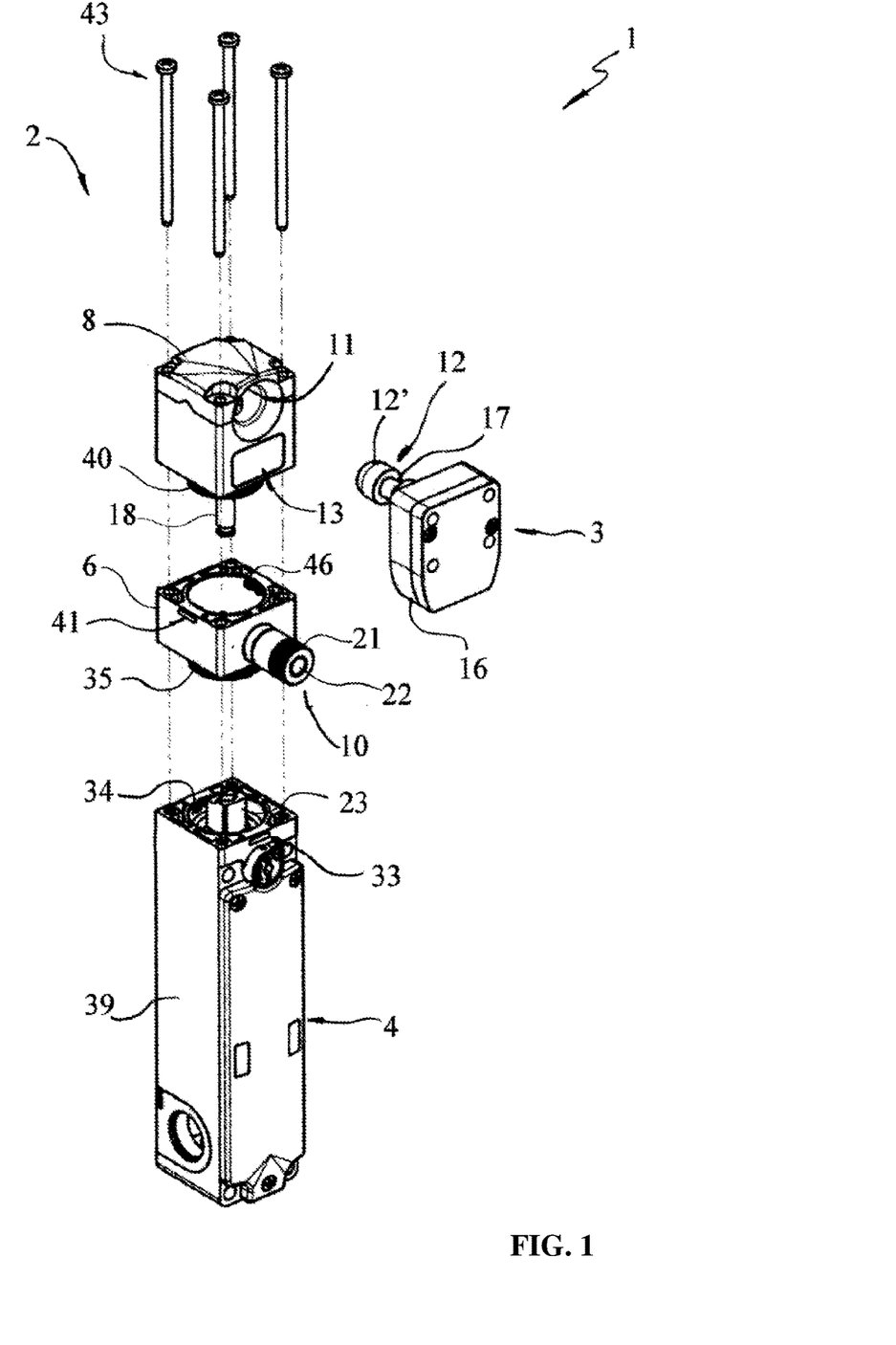
FIG. 1 is an elevated exploded view of a switch of the invention in a first preferred embodiment.

FIG. 1 shows a first embodiment of a hand-operated switch with time delay, generally indicated with 1, comprising a switching device 2 adapted to be anchored to the fixed part of the protection, close to the access to be monitored, and an operating device 3 adapted to be anchored to the movable part of the protection designed to occlude the access to be brought close to the switching device 2 upon the closing movement of the movable part.

The switching device 2 is composed essentially of three modules which may be integral with each other or mutually assembled in a removable manner.

In particular, the switching device 2 comprises a lower case 4 which extends along a longitudinal axis X and internally houses switching means 5 adapted to be operatively connected to the power supply circuit of the plant and possibly to one or more further command and/or service circuits of the plant for controlling the same.

Figure 2:
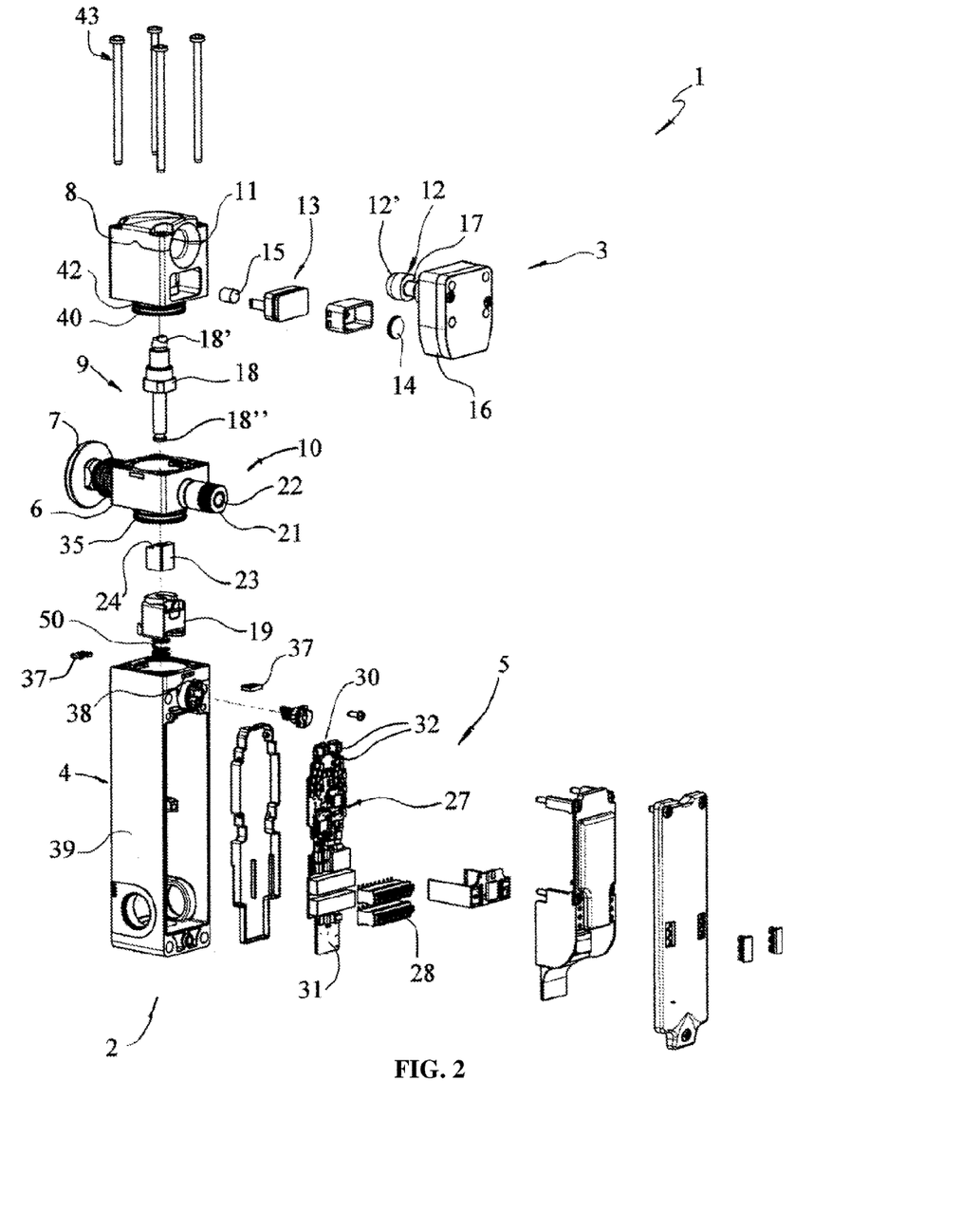
FIG. 2 is an elevated exploded view of a switch of the invention in a second preferred embodiment.

The case 4 is also provided with an intermediate module 6 which may be optionally provided with one or more hand-operable emergency buttons 7 for operating on the switching means 5 in particular unsafe conditions, as provided for example in the configuration of FIG. 2, that differs from the previous essentially for this element only.

The emergency button 7 will be selected between the emergency mushroom-buttons, as in the figure, the unlocking key devices or other manual unlocking devices suitable to operate directly on the switching means 5 bypassing any possible electronic controls.

In particular, the emergency button 7 may be configured to project toward the inside of the protection so that it can be actuated from the inside of the same and thus cause the system downtime in a situation of danger, for example in the case where a operator remains within the security barrier after its closure with the consequent start of the plant.

Above the intermediate module 6 there is also an upper head 8 designed to interact with the operating device 3 in the closing phase of the protection.

In these first configurations, the case 4 will be substantially elongated along the longitudinal axis X and substantially symmetrical with respect to a longitudinal plane passing through the same and the head 8 will substantially central relative to the case 4.

Figure 3:
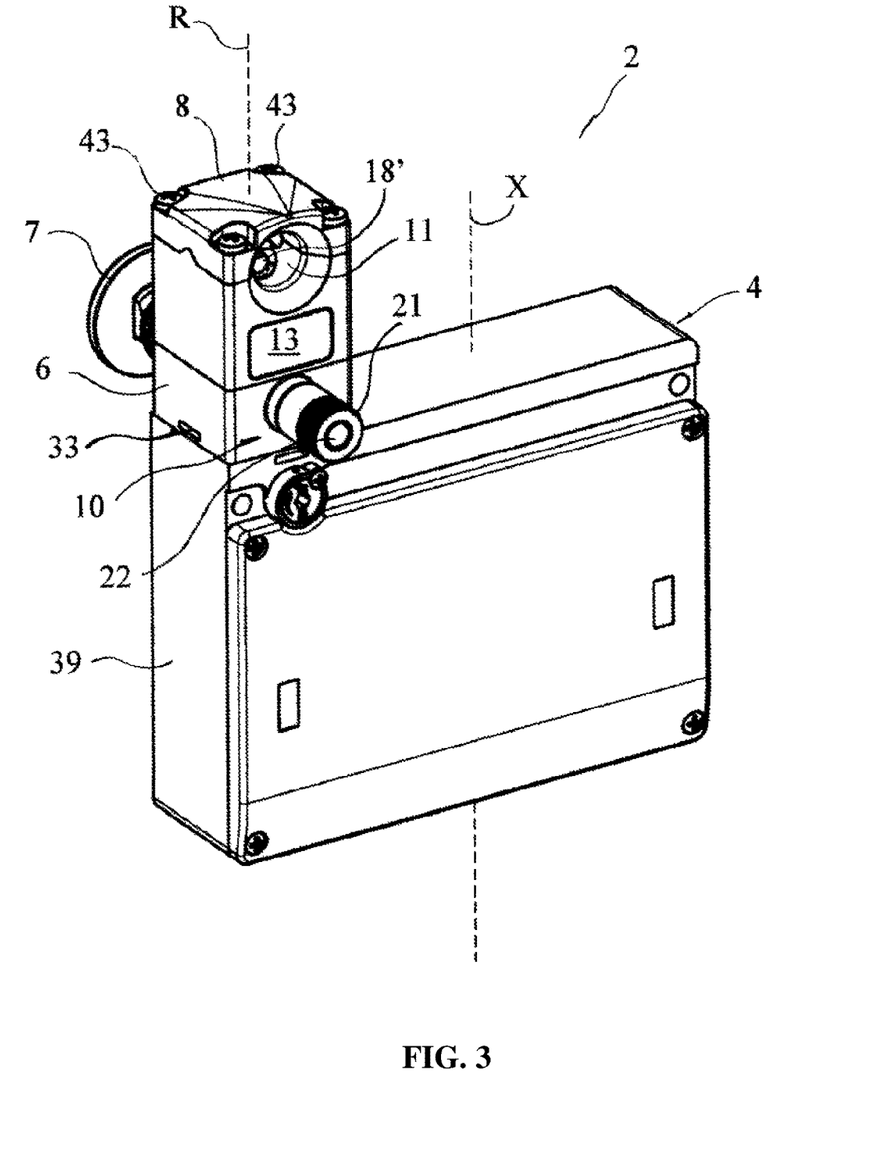
FIG. 3 is an elevated view of a switch of the invention in a third preferred embodiment.
Figure 4:
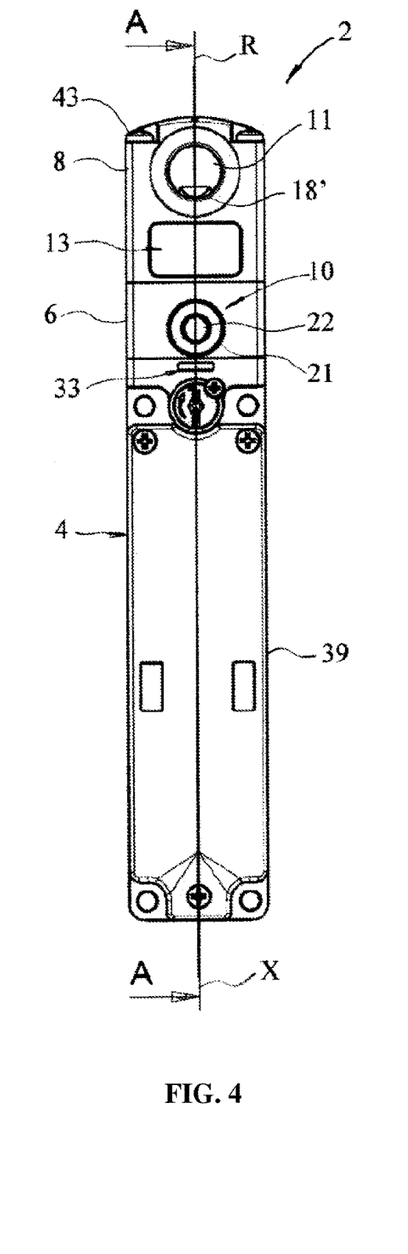
FIG. 4 is a front view of the switching device of the switch of FIG. 1.

FIG. 3 illustrates a third configuration of a switch device 2 which differs from that of FIG. 1 essentially by the fact that the case 4 does not have a main longitudinal extension and the head 8 is arranged asymmetrically thereon.

Regardless of the specific configuration of the case 4, a locking mechanism 9, associated with the switching means 5 and adapted to selectively retain/release the operating device 3 after the opening/closing of the power supply circuit by the switching means 5, will be housed inside the case 4.

The intermediate module 6 houses in turn unlocking means 10 hand-operable from the outside and operatively coupled to the locking mechanism 9 to perform the unlocking of the operating device 3 with a predetermined time delay with respect to the switching of the power circuit by the switching means 5 according to operating procedures disclosed below.

The head 8 will have a centering hole 11 designed to receive a centering pin 12 projecting transversely from the operating device 3 to be inserted into the centering hole 11 at the closure of the protection, so as to engage the locking mechanism 9 and also allow a sufficiently precise alignment of the operating device 3 with the head 8.

The head 8 is also provided with sensor means 13 operatively coupled to the switching means 5 to modify its state as a function of an input signal coming from the operating device 3.

This latter, in turn, is provided with a transmitter 14 adapted to send a proximity signal designed to be received as input from the sensor means 13 and then to be sent by the latter to the switching means 5 when the transmitter 14 is placed at a predetermined minimum distance, so as to determine the closing of the supply circuit of the plant.

Preferably, the transmitter 14 will be a transponder or the like adapted to send the proximity signal to the sensor means 13, provided in turn with one or more receivers 15 adapted to receive the signal when the distance between the operating device 3 and the head 8 is at least equal to a predetermined minimum value sufficient for considering the protection closed.

The hole 11 and the centering pin 12 will therefore have the aim of aligning precisely the transmitter 14 and the receiver 15 in order to recover any play or misalignment between these elements caused by the assembly or use of the switch 1.

The head 8 may be appropriately mounted in a rotatably manner on the intermediate module 6 of the case 4 so as to rotate the centering hole 11 and/or the sensor means 13 relative to the case 4 about a same axis of rotation R, preferably longitudinal and substantially central with respect to the head 8, and which may or not coincide with the longitudinal axis X of symmetry of the case 4.

The ability to rotate the head 8 will allow to change the angular orientation relative to the case 4 and to adapt the configuration of the switch device 2 to the relative position of the operating device 3 and to the type of closure of the protection.

In the attached figures the head 8 is shown as a unitary body in which the centering hole 11 and the sensor means 13 can rotate only integrally with each other.

However, according to an alternative configuration, not shown in these figures, the head 8 may be composed of two distinct portions provided respectively with the centering hole 11 and with the sensor means 13 to allow their angular orientation relative to the case 4 in a mutually independent manner.

Similarly, the intermediate module 6 may also be designed so as to be rotatable relative to the case 4 and/or to the head 8 to orient the emergency buttons 7 and/or the unlocking means 10 in an independent manner with respect of the centering hole 11 and of the sensor means 13.

The operating device 3 comprises essentially a base 16 designed to be anchored to the movable part of the protection in a direct manner or through appropriate mounting brackets, not shown, and which will house thereinside the transmitter 14, which will be suitably arranged below the centering pin 12.

The latter will protrude transversely from the base 16 and will have mainly cylindrical shape with an inner end inserted into the base 16 so that it can have a slight oscillation useful to recall the possible misalignment with the center hole 11.

The pin 12 will have a rounded or tapered outer end 12' to facilitate its insertion into the centering hole 11 and operate on the switching means 5, as described below.

The pin 12 will also have a intermediate peripheral recess 17 to interact with the locking mechanism 9 and in which possible holding elements, not visible in the figures, arranged in the centering hole 11 may fit.

The centering hole 11 will preferably be a hole passing through transversely to the head 8 to be accessible by the centering pin 12 from both transverse end sections, regardless of the position of the receiver 15.

Furthermore, the centering hole 11 will be substantially cylindrical with one or both flared ends sections to define an invitation for the centering pin 12 and facilitate the mutual coupling even in the presence of relatively marked misalignments.

The locking mechanism 9 will extend mainly in the longitudinal direction through the case 4 and the intermediate module 6 and will comprise a longitudinal rod 18 mechanically coupled to the unlocking means 10 to translate longitudinally with a predetermined maximum stroke between a first limit locking position of the operating device 3 and a second limit unlocking position thereof.

Figure 5:
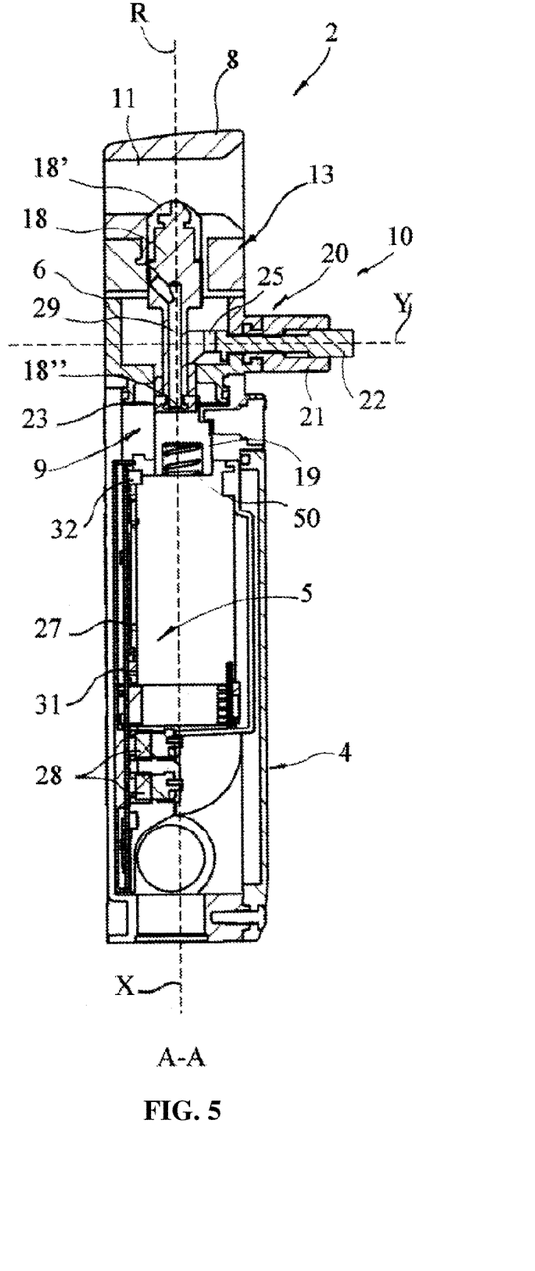
FIG. 5 is a sectioned view of the device of FIG. 4 according the A-A section plane.

FIG. 5 shows the longitudinal rod 18 in the first limit locking position in which it has its upper end 18' projecting into the centering hole 11 for engaging the recess 17 of the centering pin 12 and locking the operating device 3 on the head 8 preventing unauthorized opening of the protection.

The unlocking means 10 will be in a first extracted operating condition in which they do not interact with the locking mechanism 9.

This latter will also include a slider 19 operatively coupled to the lower end 18" of the rod 18 to be dragged by the same downwardly following its sliding from the first position to the second limit position promoted by the unlocking means 10.

Figure 6:
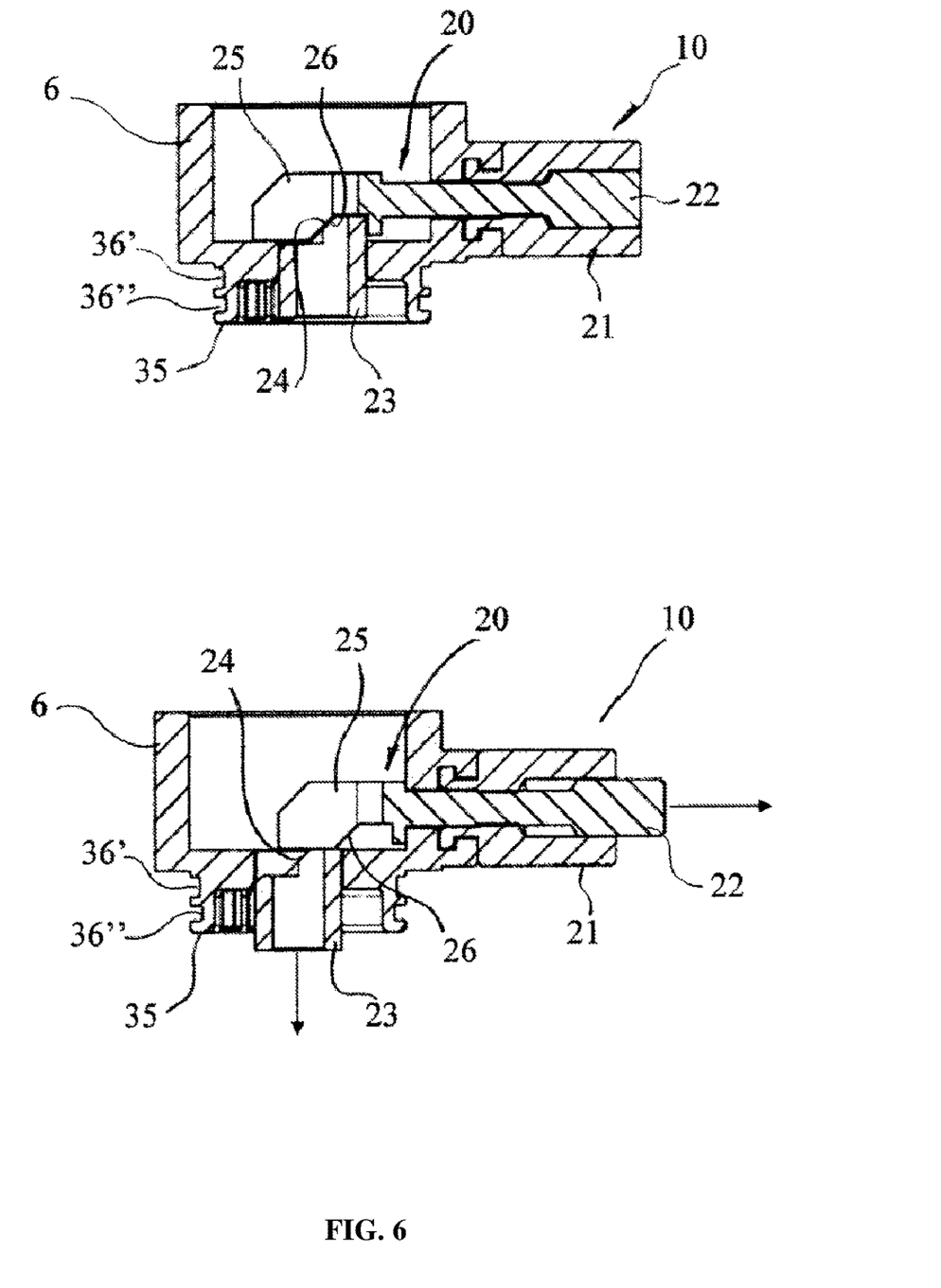
FIG. 6 is an enlarged section view of a detail of the switching device of the switch of FIG. 1 or FIG. 3 in two different working conditions.

As more clearly shown in FIG. 6, the unlocking means 10 will be housed in the intermediate module 6 and will comprise a mechanism 20 of the nut/screw type having an outer driving element 21 defined by a manually maneuvered wheel to rotate about a transverse axis of rotation Z.

The kinematic mechanism 20 will also comprise an actuator 22 with a threaded portion for engaging with the wheel 21 and be dragged downwardly in the transverse direction following the rotation of the wheel 21 between a first position projecting inwardly to a second position projecting outwardly, in which positions the actuator 22 may or may not be completely contained in the intermediate module 6 or project outwardly, in function of its specific transverse dimension, not limiting the present invention.

In this way the movement of the actuator 22 corresponds to an action on the rod 18 to move it between the first and the second limit position.

In particular, the rod 18 will comprise a pushing element 23 associated with its lower end 18" and arranged to push the slider 19 following the sliding down of the rod 18.

The pushing element 23 will have a first sloped contact surface 24 adapted to interact with an inclined plane end element 25 of the actuator 22 having a sloped second contact surface 26 facing the first 24.

Thus, the two contact surfaces 24, 26 may be able to mutually slide to cause the longitudinal translation of the rod 18 following the sliding of the actuator 22.

Operatively, the sliding of the actuator 22 from the first position projecting inwardly to that projecting outwardly will cause the sliding down of the pushing element 23, and therefore of the rod 18 that will make free the hole 11 providing for the unlocking of the operating device 3.

When the unlocking means 10 will be operated in the reverse direction, carrying the actuator 22 from the second position to the first, the inclined plane end element 25 will free the pushing element 23 allowing it to return upwards as a result of action of a elastic element 50 acting in the longitudinal direction, located in the case 4.

However, it seems obvious that the configuration of the unlocking means 10 and the related kinematic mechanism 20 may be different from that illustrated, even significantly, without for this reason departing from the scope of the present invention.

With reference to the switching means 5, as most clearly visible from FIG. 2, they will preferably be of the electromechanical or electronic type and comprise a logic control microprocessor unit 27, for example an electronic board, which in turn will be associated to a terminal block 28 for connection to the power supply circuit of the plant and optionally to one or more additional control and/or circuits service of the plant to be switched.

The terminal block 28 may include two or more pairs of terminals for connection of respective connection cables to the control and/or service circuits of the machine or plant, so as to switch the same between the states of opening and closing as a function of activation of the locking mechanism 9.

By way of example, the switching means 5 may be connected to the power supply circuit of the machine or plant, in order to command its downtime at the opening of the protection, or, they may be also connected to the emergency or signaling circuits, according to known methods.

In particular, the switching means 5 may be designed in a similar way as provided in the safety switch disclosed in application WO2013098788 in the name of the same Applicant, to which reference is made for greater detail.

However, it is understood that the features of the switching means 5 may also be different and do not represent a limitation on the scope of protection of the present invention.

Even the sensor means 13, in particular the receiver 15, and transmitter 14 may be designed in an identical or technically equivalent manner to the analogous elements present in the switch of the above-cited application WO2013098788, so as to define a coupling of the Tag/RFID type.

In particular, as already mentioned above, the transmitter 14 may be a transponder adapted to send a presence signal associated with an identification code.

The receiver 15 may be for example an antenna adapted to be aligned to the transponder 14 for receiving the proximity signal together with the identification code when the transponder 14 is located at a predetermined minimum distance from the head 8, so as to send the identification code to the logic control unit 27.

According to a preferred but not exclusive configuration, the control logic unit 27 may be programmed to define for the closing phase of a minimum distance that must be reached by the operating device 3 with respect to the head 8 to provide the consent to the start of the plant and a maximum distance of greater value for the same elements in the opening phase to determine the system downtime, to make more safe the closing phase but at the same time to take into account any plays and to avoid that the control unit 27 erroneously receives a signal of door open even in cases in which the same is closed.

The logic control unit 27 will have stored in memory the same identification code in order to allow the switching of the power supply circuit of the plant from the opening state opening to the closing state only in the case of correspondence between the transmitted code and the stored one, thus enabling the safe start of the system.

Suitably, the receiver 15 will be completely contained in the head 8 and may be provided with one or two opposites reading points, positioned inferiorly to the respective open end sections of the centering hole 11 so as to have the operating device 3 indifferently in correspondence of any one of the sides of the head 8 provided with respective end sections of the hole 11 and thus further simplifying the operation of orientation of the head 8.

The receiver 15 will be connected to the logic control unit 27 through electrical or electronic connection means, such as one or more cables, not shown, which run along a substantially longitudinal passage 29 that extends along the head 8 and the case 4, and preferably at least partially through the rod 18, so as to enable rotation of the head 8 without compromising the integrity of the cables and avoiding contact with the unlocking means 10.

The switching means 5 will also comprise an electronic position detector 30 connected to the logic control unit 27, for example mounted on the same support 31 of the electronic board 27 and housed in the case 4 in such a position as to detect the translation of the longitudinal rod 18 toward the second limit position upon a partial longitudinal stroke thereof with value less than the maximum stroke and such that it does not allow the unlock of the operating device 3.

In addition, the electronic detector 30 will be designed to send to the logic control unit 27 a control signal for the opening of the power supply circuit.

Consequently, the need to manually move the wheel 21, or homologous alternative unlocking kinematic mechanism, will ensure that a not negligible even if minimal time, will need from the moment in which the cursor 19 interacts with the detector 30 for the opening of the power supply circuit and the moment in which the unlocking means 10 complete their stroke required to push down the rod 18 and unlock the operating device 3 from the switching device 2.

Thus, the necessary delay between the opening of the supply circuit, with consequent stop of the plant, and the unlocking of the operating device 3 necessary for opening the protection will be determined.

The electronic position detector 30 may be selected from the group comprising optical, magnetic and the like detectors.

In the shown configurations the detector 30 is constituted by a pair of photodiodes 32, always visible in FIG. 2 as well as in FIG. 5, arranged on the support 31 of the board 20 into position transversely offset from each other to define a space designed to be crossed by the slider 19 following a partial stroke of a value not sufficient to allow the unlocking of the rod 18.

According to a first operating mode, the slider 19 after a partial downward translation will free the space between the two photodiodes 32 allowing them to communicate and send the control signal to the logic unit 27, which will open the circuit accordingly.

According to another operating mode, the switching means 5 will act in reverse, sending the control signal when the slider 19 is located between the two photodiodes 32, interrupting the communication therebetween.

Similarly, the passage in the reverse direction of the slider 19, corresponding to the lift of the rod 18 from the unlocked position to the locking position of the operating device 3 may generate a second signal allowing the closure of the power supply circuit for starting the plant in the locked condition for the operating device 3.

According to a further particularly advantageous aspect, the case 4 will comprise first axial fastening means 33 of the intermediate module 6 adapted to prevent or limit its longitudinal translation relative to the case 4, but at the same time leaving it free to rotate about the central axis R.

In particular, the case 4 will be provided with a cylindrical upper opening 34 for the insertion of a first axial tubular projection 35 of the intermediate module 6.

The first projection 35 will comprise an outer peripheral groove 36' in which the first axial fastening means 33, which for example comprise pairs of fins 37 adapted to be transversely inserted into corresponding diametrically opposite slots 38 made in the side wall 39 of the case 4 to engage by opposite sides the peripheral groove 36', will fit.

In this way, once the fins 37 will be inserted in the peripheral groove 36' through the respective slots 38, it will avoid that the intermediate module 6 may be removed from the case 4.

At the same time, however, as long as the final fixing is provided, the peripheral groove 36' will always be slidable with respect to the fins 37 to allow the at least partial rotation of the intermediate module 6 necessary to obtain the desired orientation.

In turn, the intermediate module 6 will be substantially tubular to house a second axial tubular projection 40 of the head 8 similar to the first 35 and adapted to be inserted in the intermediate module 6 for interacting with second fastening means 41 of the intermediate module 6 substantially similar to the first 33 for axially locking the head 8, leaving still free to rotate about the central axis R.

In a manner similar to the first tubular projection 35, the second projection 40 also includes a respective outer peripheral groove 42 adapted to be engaged by fins of the second fastening means 41.

Both the first and the second protrusion 35, 40 may present a further peripheral groove, of which the groove 36″ belonging to the first projection 35 is clearly visible in FIG. 6, for housing respective gaskets, not shown.

The stable fixing of the head 8 on the case 4 will be obtained by longitudinal screws 43 to be inserted in suitable seats of the head 8, of the intermediate module 6 and of the case 4 once their mutual orientation will be selected.

Figure 7:
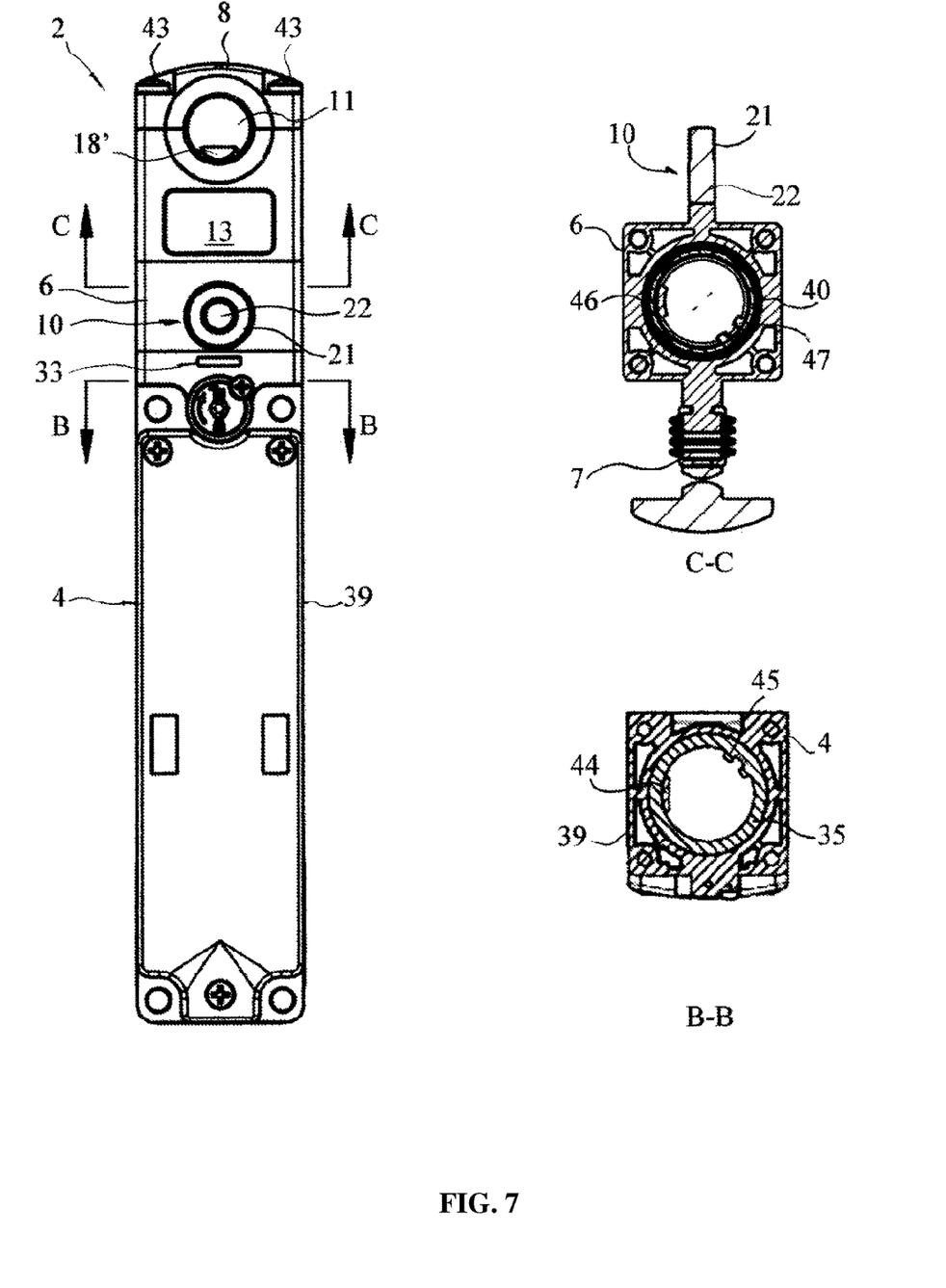
FIG. 7 is a front view of the switching device of the switch of FIG. 2, associated with two different cross sections according the B-B and C-C section planes.

As shown in FIG. 7, the case 4 and the first tubular projection 35 of the intermediate module 6 will also be provided respectively with a first 44 and a second abutment element 45 adapted to interact with each other upon their relative rotation to limit it to a value less than 360°.

In particular, the first abutment element 44 will radially project inwardly from the side wall of the cylindrical opening 34 to impact, due to the rotation of the intermediate module 6, the second abutment element 45 which radially extends inwardly from the first tubular projection 35.

In turn, the intermediate module 6 comprises, from the side of the head 8, a third abutment element 46 adapted to interact with a fourth abutment element 47 which extends transversely from the second tubular projection 40 for limiting the relative rotations to a value less 360°.

Figure 8:
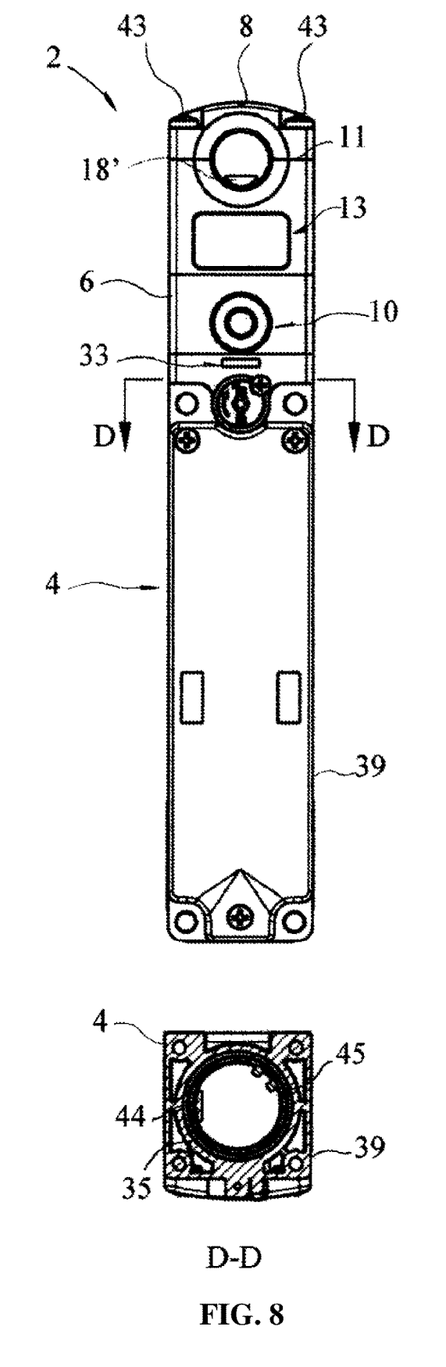
FIG. 8 is a front view of the switching device of the switch of FIG. 2 with the head mounted with a first angular orientation and associated to a cross section according the D-D section plane.
Figure 9:
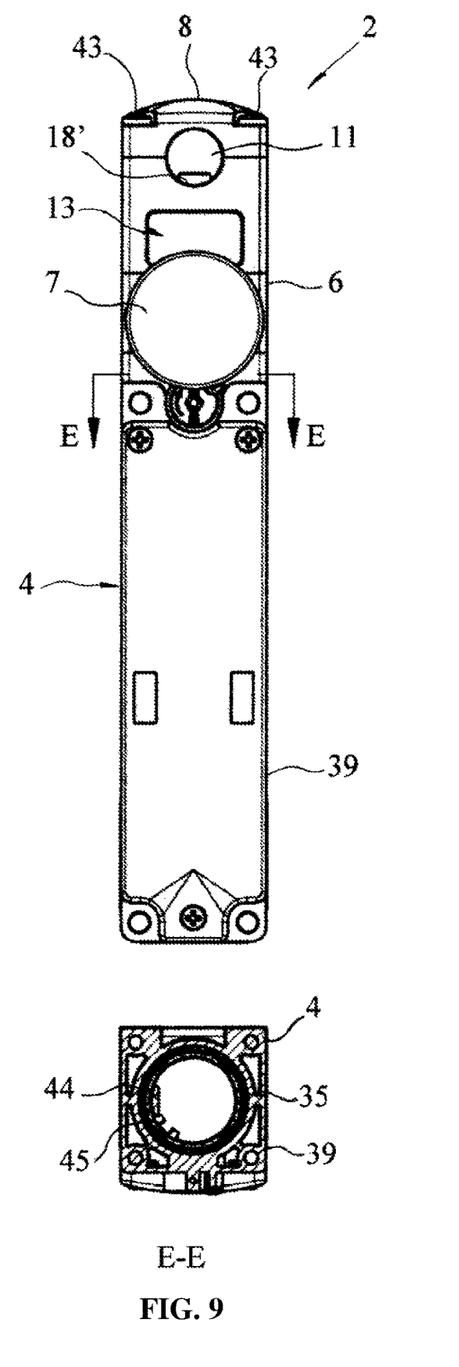
FIG. 9 is a front view of the switching device of the switch of FIG. 2 with the head mounted with a second angular orientation rotated of 180° with respect to FIG. 8 and associated to a cross section according the E-E section plane.

FIGS. 8 and 9 show the switch device 2 with the head 8 and the intermediate module 6 in two configurations different between them for the angular orientation relative to the case 4 and in which the head 8 and the module 6 are rotated by 180°.

From above it appears evident that the switch according to the invention reaches the intended objects and in particular to provide a hand-operated safety switch with time delay which is particularly safe and prevents unauthorized openings and/or closings of the relative accesses, always guaranteeing that the start of the plant takes place in safe condition of closed protection.

The switch according to the invention is susceptible to numerous modifications and variations, all falling within the inventive concept expressed in the accompanying claims. All the details may be replaced with other technically equivalent elements, and the materials may be different according to requirements, without departing from the scope of the present invention.

Even if the switch has been disclosed with particular reference to the accompanying figures, reference numbers used in the description and in the claims are used to improve the intelligence of the invention and do not constitute limitation of the claimed scope.

The invention claimed is:

1. An hand-operated safety switch with time delay, particularly for protection barriers or panels of industrial plants, comprising:
    a switching device (2) adapted to be anchored to a fixed part of the protection and provided with switching means (5) adapted to be operatively coupled with at least one power supply circuit of the plant to be controlled for opening/closing thereof;
    an operating device (3) adapted to be anchored to a movable part of the protection for interacting with said switching means (5) upon the closing of the movable part on the fixed part;
    wherein said switching device (2) comprises a locking mechanism (9) associated with said switching means (5) and adapted to selectively hold/release said operating device (3) and hand-operable unlocking means (10) operatively coupled with said locking mechanism (9) for unlocking said operating device (3) with a predetermined time delay with respect of the switching of the power supply circuit by said switching means (6);
    characterized in that said switching device (2) has sensor means (13) operatively coupled with said switching means (6) for modifying their operative condition in function of an inlet signal, said operating device (3) comprising in turn a transmitter (14) adapted to send a proximity signal to be received as input by said sensor means (13) for controlling said switching means (5) when said transmitter (14) is placed at a predetermined minimum distance from said sensor means (13), said locking mechanism (9) comprising an inner passage (29) adapted to allow the passage of means for connecting said sensor means (13) with said switching means (5) avoiding the interference with said unlocking means (10).

2. Switch as claimed in claim 1, characterized in that said operating device (3) has a centering pin (12) adapted to be introduced, upon the closing of the protection, into a centering hole (11) provided into said switching device (2) for engaging said locking mechanism (9), said switching device (2) having a case (4) defining a longitudinal axis (X) housing said switching means (5) and said locking mechanism (10) and fastened to a head (8) provided with said centering hole (11) and with said sensor means (13).

3. Switch as claimed in claim 2, characterized in that said locking mechanism (9) comprises a longitudinal rod (18) mechanically associated with said unlocking means (10) for longitudinally translating with a predetermined maximum stroke between a first limit position for locking said operating device (3) and a second limit position for unlocking the same.

4. Switch as claimed in claim 3, characterized in that said switching means (5) comprise an electronic position detector (30) connected with said logic control unit (27) and housed into said case (4) arranged in such a position as to detect the translation of said longitudinal rod (18) toward said second limit position upon a partial longitudinal stroke thereof less than said maximum stroke to send a control signal to said logic control unit (27) for opening the power supply circuit.

5. Switch as claimed in claim 4, characterized in that said electronic position detector (30) is selected into the group comprising the optical and magnetic detectors or the like.

6. Switch as claimed in claim 4, characterized in that said unlocking means (10) comprise a kinematic mechanism (20) having an outer handle element (21) connected with an actuator (22) slidable into said case (4) between a first position and a second position for operating on said rod (18) and producing said longitudinal translation.

7. Switch as claimed in claim 6, characterized in that said rod (18) and said actuator (20) comprise respective sloped mutual contact surfaces (24, 26) reciprocally facing and adapted to slid over one another for determining the longitudinal translation of said rod (18) upon the sliding of said actuator (20).

8. Switch as claimed in claim 2, characterized in that said head (8) is movably fastened to said case (4) for at least partially rotating about a rotation axis (R) substantially central with respect of said head (8) and modifying the orientation of said centering hole (11) and/or of said sensor means (13) with respect of said case (4).

9. Switch as claimed in claim 1, characterized in that said switching means (5) are of the electronic or electromechanical type and comprise a microprocessor logic control unit (27) connected with said sensor means (13) and associated with a terminal block (28) for connection with the power supply circuit and optionally with one or more further control and/or service circuits of the plant to be switched.

10. Switch as claimed in claim 9, characterized in that said transmitter (14) is a transponder adapted to send said proximity signal associated with an identification code, said sensor means (13) comprising a receiver (16) adapted to be located close to said transponder (14) for receiving said proximity signal and sending said identification code to said control logic unit (27).

\* \* \* \* \*